United States Patent
Ohoka et al.

(10) Patent No.: US 9,923,090 B2
(45) Date of Patent: Mar. 20, 2018

(54) SILICON CARBIDE SEMICONDUCTOR ELEMENT AND METHOD FOR MANUFACTURING THE SAME

(71) Applicant: Panasonic Intellectual Property Management Co., Ltd., Osaka (JP)

(72) Inventors: Atsushi Ohoka, Kyoto (JP); Masao Uchida, Osaka (JP); Nobuyuki Horikawa, Kyoto (JP); Osamu Kusumoto, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/403,381

(22) Filed: Jan. 11, 2017

(65) Prior Publication Data

US 2017/0125575 A1 May 4, 2017

Related U.S. Application Data

(63) Continuation of application No. PCT/JP2015/003590, filed on Jul. 16, 2015.

(30) Foreign Application Priority Data

Jul. 24, 2014 (JP) ................................ 2014-151031

(51) Int. Cl.
*H01L 29/78* (2006.01)
*H01L 29/16* (2006.01)
(Continued)

(52) U.S. Cl.
CPC ...... *H01L 29/7803* (2013.01); *H01L 27/0617* (2013.01); *H01L 29/105* (2013.01);
(Continued)

(58) Field of Classification Search
CPC .................................................. H01L 29/7803
See application file for complete search history.

(56) References Cited

U.S. PATENT DOCUMENTS

| 2002/0048855 A1 | 4/2002 | Matsudai et al. |
| 2003/0168718 A1 | 9/2003 | Matsudai et al. |
| (Continued) | | |

FOREIGN PATENT DOCUMENTS

| JP | 2002-110985 | 4/2002 |
| JP | 2009-032919 | 2/2009 |
| (Continued) | | |

OTHER PUBLICATIONS

International Search Report of PCT application No. PCT/JP2015/003590 dated Sep. 29, 2015.

*Primary Examiner* — Daniel Whalen
(74) *Attorney, Agent, or Firm* — McDermott Will & Emery LLP

(57) ABSTRACT

In the silicon carbide semiconductor element, a second silicon carbide semiconductor layer that is in contact with the surface of a first silicon carbide semiconductor layer has at least an upper layer including a dopant of a first conductivity type at a high concentration. Above a junction field effect transistor (JFET) region interposed between body regions that are disposed in the first silicon carbide semiconductor layer so as to be spaced from each other, the silicon carbide semiconductor element has a channel removed region, which is a cutout formed by removing a high concentration layer from the front surface side of the second silicon carbide semiconductor layer, the high concentration layer having a higher dopant concentration than at least the dopant concentration of the JFET region. The width of the channel removed region is smaller than that of the JFET region.

15 Claims, 10 Drawing Sheets

(51) Int. Cl.
  *H01L 27/06* (2006.01)
  *H01L 29/10* (2006.01)
  *H01L 29/66* (2006.01)
  *H01L 29/80* (2006.01)

(52) U.S. Cl.
  CPC ...... *H01L 29/1095* (2013.01); *H01L 29/1608* (2013.01); *H01L 29/66068* (2013.01); *H01L 29/80* (2013.01)

(56) References Cited

U.S. PATENT DOCUMENTS

2006/0057796 A1    3/2006  Harada et al.
2013/0313576 A1*  11/2013  Nakano ............... H01L 29/8611
                                                       257/77
2014/0113421 A1    4/2014  Harada et al.

FOREIGN PATENT DOCUMENTS

| JP | 2010-027833 | 2/2010 |
| JP | 2011-023757 | 2/2011 |
| JP | 2013-149837 | 8/2013 |
| WO | 2010/073991 | 7/2010 |
| WO | 2011/089861 | 7/2011 |
| WO | 2014/083771 | 6/2014 |

* cited by examiner

SILICON CARBIDE SEMICONDUCTOR ELEMENT AND METHOD FOR MANUFACTURING THE SAME

BACKGROUND

1. Technical Field

The present disclosure relates to a semiconductor element, and more particularly to a silicon carbide semiconductor element such as a power semiconductor device used for high breakdown voltage and large current, and a method for manufacturing the silicon carbide semiconductor element.

2. Description of the Related Art

Silicon carbide (SiC) is a high-hardness semiconductor material having a band gap larger than that of silicon (Si), and is applied to various semiconductor devices such as a power element, an environmentally-resistant element, a high-temperature operation element, and a high-frequency element. Among these elements, application to power elements, such as a semiconductor element and a rectifier element, is gaining attention. Power elements using SiC have an advantage that they can significantly reduce power loss, compared to power elements using Si. In addition, by utilizing such properties, SiC power elements can implement a more compact semiconductor device as compared to Si power elements.

A field effect transistor (FET) having a metal-oxide-semiconductor (MOS) structure is a typical semiconductor element among various power elements that use SiC. In this description, an FET having a MOS structure is referred to as a "MOSFET".

A semiconductor element using SiC is expected to implement high breakdown voltage and to reduce a loss when the semiconductor element is energized. In addition, MOSFET is a majority carrier device, and enables a unipolar operation, and thus, is expected to serve as a high-speed switching element. Therefore, a MOSFET using SiC (hereinafter referred to as "SiC-MOSFET") is demanded to reduce conduction loss and switching loss simultaneously.

For example, a configuration disclosed in PTL 1 has been known as a conventional configuration to reduce conduction loss (particularly, see FIG. 1 in PTL 1). In the configuration disclosed in PTL 1, a high-concentration n-type epitaxial layer is formed on a low-concentration n-type drift, layer, and the n-type epitaxial layer is used as a channel layer. The configuration having the channel layer enables the flow of carriers to keep away from an interface of a gate insulating film. Accordingly, this configuration can prevent scattering of carriers with defects near the interface, thereby being capable of increasing field-effect mobility, and thus, being capable of reducing conduction loss of the semiconductor element.

On the other hand, an increase in a switching speed is effective to reduce switching loss. However, to increase the switching speed, it is necessary to reduce gate resistance and to reduce various capacitive components such as input capacitance or feedback capacitance. Among these various capacitive components, in particular, feedback capacitance, that is, gate-drain capacitance, most largely contributes to switching loss. Therefore, the reduction in the gate-drain capacitance is inevitable to ensure a high-speed operation with less loss.

For example, a configuration disclosed in PTL 2 has been known as a conventional configuration to reduce gate-drain capacitance. FIGS. 2 and 3 in PTL 2 are cross-sectional views illustrating a vertical MOSFET having a conventional configuration, wherein a gate electrode is removed from a part of a portion on a junction field effect transistor (JFET) region interposed between p-type body regions. According to this configuration, the area where the gate electrode and the JFET region overlap each other is reduced in a planar view, whereby the gate-drain capacitance can be reduced. The configuration having the above features is also applied to a semiconductor element using SiC.

CITATION LIST

Patent Literature

PTL 1: Unexamined Japanese Patent Publication No. 2010-27833

PTL 2: International Publication No. 2010/073991

SUMMARY

The configuration, disclosed in PTL 1 enables reduction in conduction loss, because a high-concentration n-type epitaxial layer is formed. On the other hand, the n-type epitaxial layer is also formed on the JFET region. Therefore, when the semiconductor element is turned off, a spread of a depletion layer, which is expected to extend toward a substrate from the gate insulating film, is suppressed. The higher the concentration of the n-type epitaxial layer is, the smaller the extension of the depletion layer below the gate insulating film is, and the gate-drain capacitance is the highest when the extension of the depletion layer is small. That is, the high-concentration n-type epitaxial layer has an effect of reducing conduction loss, but entails an increase in the gate-drain capacitance and switching loss.

The increased gate-drain capacitance in the semiconductor element having the n-type epitaxial layer can be improved by the configuration disclosed in PTL 2, for example. However, in the configuration disclosed in PTL 2, a part of a gate electrode is removed, and thus, this configuration has a problem of decrease in the cross-sectional area where a gate current can flow by the removed area. Accordingly, from the viewpoint of a high-speed operation with low loss, the gate resistance is increased, and the gate drive power is decreased, and this cancels the effect of reducing the gate-drain capacitance.

The present disclosure is accomplished in view of the above two problems, and an object of the present disclosure is to enable both the reduction in conduction loss and the reduction in switching loss. Particularly, an object of the present disclosure is to reduce gate-drain capacitance without increasing gate resistance in a vertical SiC-MOSFET which has a channel layer for the purpose of reducing conduction loss.

In order to solve the above problems, a silicon carbide semiconductor element according to the present disclosure includes unit cells which are integrated, each unit cells includes a semiconductor substrate of a first conductivity type; a first silicon carbide semiconductor layer of the first conductivity type located on a front surface of the semiconductor substrate; a drain electrode located on a back surface of the semiconductor substrate; a plurality of body regions of a second conductivity type located in the first silicon carbide semiconductor layer so as to be spaced from each other; a source region of the first conductivity type located in the body regions; and a source electrode electrically connected to the source region. The each unit cell also includes a junction field effect transistor (JFET) region of the first conductivity type in a region where the body region is not, located on a surface of the first silicon carbide semiconductor layer in a planar view, a second silicon carbide semiconductor layer of the first conductivity type located on the surface of the first silicon carbide semiconductor layer, a gate insulating film located on the surface of the second silicon carbide semiconductor layer, and a gate electrode located on the gate insulating film. The second silicon carbide semiconductor layer has, on an upper part thereof, a high concentration layer including a dopant of the first conductivity type at a higher concentration than at least the concentration of the JFET region. The second silicon carbide semiconductor layer has a cutout extending from the upper surface of the second silicon carbide semiconductor layer located on a part of the JFET region to a side closer to a lower surface than to the high-concentration layer, and the width of the cutout is smaller than the width of the JFET region.

A method for manufacturing a silicon carbide semiconductor element according to the present disclosure includes: forming a first silicon carbide semiconductor layer of a first conductivity type on a front surface of a semiconductor substrate of the first conductivity type: forming at least two body regions of a second conductivity type in the first silicon carbide semiconductor layer so as to be spaced from each other; and forming a source region of the first, conductivity type in the body regions. The method also includes: forming a second silicon carbide semiconductor layer of the first conductivity type on the surface of the first silicon carbide semiconductor layer; and removing at least a part of the second silicon carbide semiconductor layer located above a JFET region, interposed between the body regions from the upper surface of the second silicon carbide semiconductor layer. The method also includes: forming a gate insulating film on the region where at least a part of the second silicon carbide semiconductor layer is removed; and forming a gate insulating film on the region where the second silicon carbide semiconductor layer is not removed.

The present disclosure can provide an effect of enabling both the reduction in conduction loss and the reduction in switching loss.

DETAILED DESCRIPTION

First Exemplary Embodiment

A semiconductor element according to exemplary embodiments of the present disclosure, will be described below with reference to the drawings.

Figure 1:
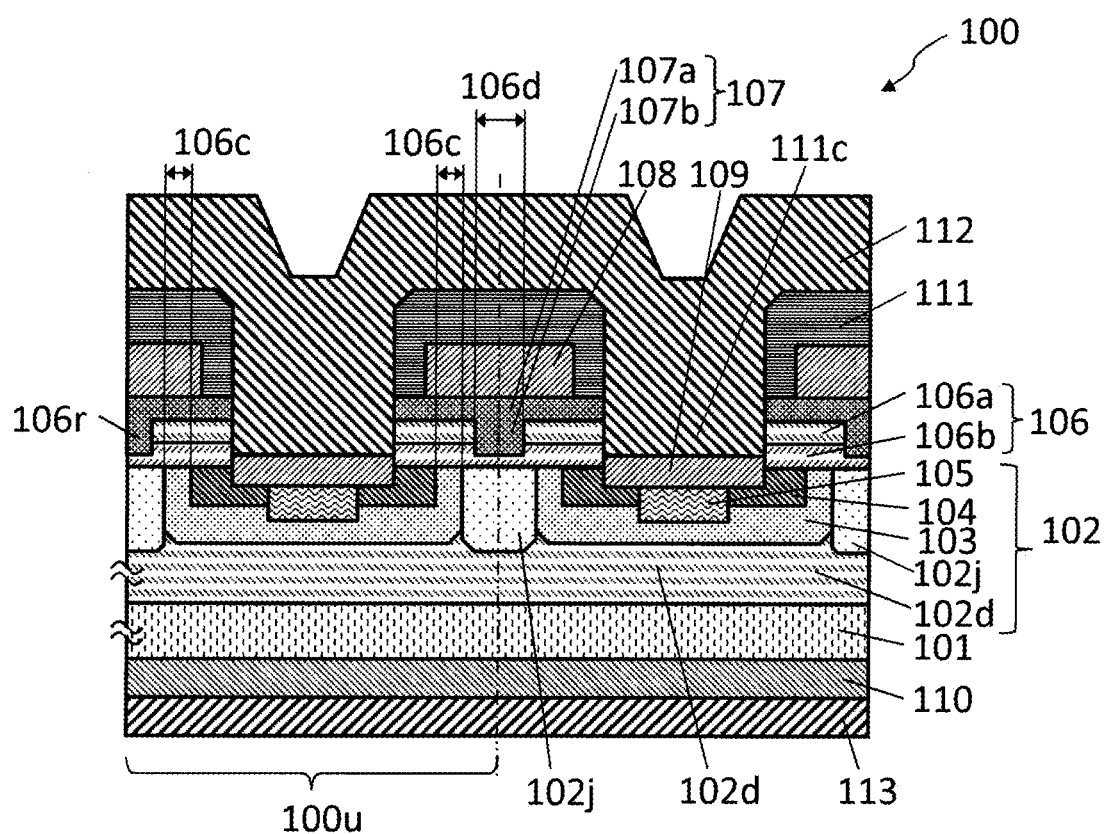
FIG. 1 is a schematic cross-sectional view of a silicon carbide semiconductor element according to a first exemplary embodiment.

FIG. 1 schematically illustrates a cross-section of silicon carbide semiconductor element 100 according to a first exemplary embodiment. FIG. 1 is a schematic cross-sectional view of a vertical SiC-MOSFET in which two unit cells 100u are arranged side by side. Commercially available silicon carbide semiconductor element 100 includes a plurality of unit cells.

(Configuration of Silicon Carbide Semiconductor Element 100)

Silicon carbide semiconductor element 100 includes semiconductor substrate 101 of a first conductivity type and first silicon carbide semiconductor layer (silicon carbide epitaxial layer) 102 of the first conductivity type located on a front surface of semiconductor substrate 101. In the present exemplary embodiment, the first conductivity type is an n type, and a second conductivity type is a p type. However, the first conductivity type may be a p type, and the second conductivity type may be an n type. Semiconductor substrate 101 has $n^+$ conductivity, and is made of silicon carbide (SiC). First silicon carbide semiconductor layer 102 is of n type. The superscript "+" or "−" added to the conductivity type "n" or "p" represents the relative concentration of dopant. For example, "n" means that the concentration of an n-type dopant added is higher than "n", while "n" means that the concentration of an n-type dopant added is lower than "n".

In first silicon carbide semiconductor layer 102, body region 103 of the second conductivity type, which is different from the first conductivity type of semiconductor substrate 101, is provided. The rest of first silicon carbide semiconductor layer 102 other than body region 103 will be referred to herein as "drift region 102d".

Body region 103 is formed by introducing a dopant of the second conductivity type into first silicon carbide semiconductor layer 102 of the first conductivity type. It should be noted that the dopant of the second conductivity type is a dopant to be introduced to obtain semiconductor of the second conductivity type, and similarly, a dopant of the first conductivity type is a dopant to be introduced to obtain semiconductor of the first conductivity type. Body region 103 includes both a dopant of the first conductivity type and the dopant of the second conductivity type and is defined to be a region in which the concentration of the dopant of the second conductivity type is higher than that of the dopant of the first conductivity type. At the bottom of body region 103, the concentration of the dopant of the first conductivity type in drift region 102d that contacts with body region 103 is as high as that of the dopant of the second conductivity type in body region 103.

Source region 104 of the first conductive type is provided in body region 103. Source region 104 is of $n^+$ type.

Preferably, contact region 105 of the second conductivity type is formed in body region 103. Contact region 105 is desirably of $p^+$ type. Source electrode 109 is formed on source region 104. Source electrode 109 is electrically in contact with, both source region 104 and contact region 105.

In drift region 102d, a region adjacent to body region 103, i.e., the region interposed between respective body regions 103 of two adjacent unit cells, will be referred to herein as junction field effect transistor (JFET) region 102j for the sake of simplicity of description. In the description below of the present first exemplary embodiment, the width of JFET region 102j is set as 1 µm. As JFET region 102j forms a part of first silicon carbide semiconductor layer 102, its dopant concentration may be the same as that of the first silicon carbide semiconductor layer. However, a dopant of the first conductivity type may be introduced into that region by ion implantation, for example, to cause the dopant concentration thereof to be higher than that of first silicon carbide semiconductor layer 102. The increase in the dopant concentration of JFET region 102j in the manner described above enables reduction in the resistance of JFET region 102j.

As illustrated in FIG. 1, JFET region 102j having a high concentration as described above is formed to have a depth larger than at least the depth of body region 103. Note that the depth of JFET region 102j herein indicates the depth at which the dopant concentration of JFET region 102j becomes equal to the dopant concentration of drift region 102d. On the other hand, it is supposed that, if the dopant concentration of JFET region 102j is set to be not higher than the dopant concentration of first silicon carbide semiconductor layer 102, the depth of JFET region 102j is equal to the depth of body region 103. The reason why the depth of JFET region 102j having a high concentration is set to be larger than the depth of body region 103 is as follows. Specifically, when silicon carbide semiconductor element 100 is on, the PN junction formed by body regions 103 adjacent to each other in the left-right direction and drift region 102d is in a reverse bias state, and a depletion layer spreads toward semiconductor substrate 101 from the PN junction interface, by which the depth of effective JFET region 102j is increased. Effective JFET region 102j herein does not mean physical JFET region 102j interposed between adjacent body regions 103, but means electrically low-resistance JFET region 102j which the electrically high-resistance region due to the depletion layer spreading from the PN junction formed by body regions 103 and drift region 102d is excluded. Therefore, the depth of effective JFET region 102j in the on state is larger than the depth of physical JFET region 102j by the width, of the depletion layer spreading from the PN junction interface. If the depth of JFET region 102j having a high concentration is smaller than the depth of effective JFET region 102j, the resistance is increased in the region which does not have a high concentration in effective JFET region 102j. To suppress the increase in the resistance, the depth of JFET region 102j having a high concentration is set to be larger than the depth of body region 103.

Second silicon carbide semiconductor layer 106 of the first conductivity type is formed on first silicon carbide semiconductor layer 102 so as to be at least partially in contact with JFET region 102j, body region 103, and source region 104.

In the present first exemplary embodiment, second silicon carbide semiconductor layer 106 is epitaxially grown. Second silicon carbide semiconductor layer 108 is formed on JFET region 102j, body region 103, and source region 104 so as to be in contact therewith. In the example illustrated in FIG. 1, second silicon carbide semiconductor layer 106 includes channel region 106c in a region which is in contact with body region 103. The length of channel region 106c (channel length L) is as indicated by each of the two double-headed arrows shown in FIG. 1. That is to say, the "channel length" of the MOSFET is defined by a horizontal size measured on the upper surface of body region 103 (i.e., the surface that contacts with second silicon carbide semiconductor layer 106) in the drawing. In the example illustrated in FIG. 1, the entire region where body region 103 and second silicon carbide semiconductor layer 106 are in contact with each other can be defined as channel length L.

Note that second silicon carbide semiconductor layer 106 has a distribution of dopant concentration in the vertical direction with respect to semiconductor substrate 101. Specifically, second silicon carbide semiconductor layer 106 has a concentration distribution in which the dopant concentration on the side contacting with later-described gate insulating film 107 is larger than the dopant concentration on the side contacting with body region 103.

For the sake of simplicity of description, it will be described below that second silicon carbide semiconductor layer 106 has a two-layer structure. In the description below, the layer contacting with source region 104 is referred to as lower layer 106b, and the layer contacting with gate insulating film 107 is referred to as upper layer 106a, in second silicon carbide semiconductor layer 106. Second silicon, carbide semiconductor layer 106 serving as a channel layer is epitaxially frown. The dopant concentration of second silicon carbide semiconductor layer 106 is mainly controlled by a flow rate of a doping gas during the epitaxial growth. In this process, a doping gas is introduced to intentionally change the dopant concentration, by which upper layer 106a and lower layer 106b are formed. Lower layer 106b in second silicon carbide semiconductor layer 106 is in an tin doped state of having a very small dopant concentration, for example. Upper layer 106a in second silicon carbide semiconductor layer 106 has an n type dopant. The border where the dopant concentration is rapidly changed is defined as the border between upper layer 106a and lower layer 106b. The side closer to gate insulating film 107 from the border is defined as tipper layer 106a, and the side closer to body region from the border is defined as lower layer 106b. In this case, the border where the dopant concentration is increased from lower layer 106b to upper layer 106a is selected. If such border is selected, the average dopant concentration of upper layer 106a is larger than the average dopant concentration of lower layer 106b, and thus, upper layer 106a is a high-concentration layer, and lower layer 106b is a low-concentration layer. Notably, in the case where the dopant concentration is continuously changed in second silicon carbide semiconductor layer (channel layer) 106, the portion with an arbitrary depth (e.g., 10 nm) from the surface close to gate insulating film 107 is defined as upper layer 106a, and the rest other than this portion is defined as lower layer 106b. It should be noted that, in this case as well, the average dopant concentration of upper layer 106a is larger than the average dopant concentration of lower layer 106b.

At least upper layer 106a of second silicon carbide semiconductor layer 106 is removed from a part of the region of second silicon carbide semiconductor layer 106 disposed on JFET region 102j. Notably, a part or entire of lower layer 106b which is in contact with upper layer 106a may be removed, or lower layer 106b may not be removed. The removing process is performed from the surface of second silicon carbide semiconductor layer 106 as described below, and therefore, second silicon carbide semiconductor layer 106 has a shape of being partially recessed. This recessed part which is a cutout of second silicon carbide semiconductor layer 106 is defined as channel removed region 106r. In the example illustrated in FIG. 1, upper layer 106a and a part of lower layer 106b included in channel removed region 106r are removed from second silicon carbide semiconductor layer 106. The width of channel removed region 106r corresponds to channel removed width 106d shown in FIG. 1. That is, the "channel removed width" is defined by a horizontal size of channel removed region 106r in the drawing. In addition, the "channel removed depth" is defined by a vertical size of channel removed region 106r with respect to the surface of semiconductor substrate 101 in the drawing.

The width (channel removed width 106d) of channel removed region 106r is set to be less than at least the width of JFET region 102j. The reason why channel removed width 106d is set as described above is as follows. Specifically, when channel removed width 106d becomes equal to or larger than the width of JFET region 102j, a conduction path of carriers formed on the uppermost surface of second silicon carbide semiconductor layer 106 is electrically isolated from JFET region 102j, when silicon carbide semiconductor element 100 is on, and therefore, the resistance of channel region 106c is increased on the portion where channel region 106c and channel removed region 106r overlap each other.

In the present first exemplary embodiment, second silicon carbide semiconductor layer existing in channel removed region 106r is removed by thermal oxidation, for example. Therefore, gate insulating film 107 is formed in channel removed region 106r. Gate insulating film 107 formed by a thermal oxidation process has a thickness larger than the channel removed depth of second silicon carbide semiconductor layer 106. However, for the sake of simplicity of description, gate insulating film 107 formed in the region where second silicon carbide semiconductor layer 106 has been present is defined as gate insulating film 107b, and the rest of gate insulating film 107 other than gate insulating film 107b is defined as gate insulating film 107a. According to this definition, the thickness of gate insulating film 107b is equal to the channel removed depth of channel removed region 106r. If lower layer 106b is not completely removed, the bottom surface of gate insulating film 107b is in contact with lower layer 106b, and if lower layer 106b is completely removed, it is in contact with JFET region 102j.

Gate insulating film 107a is formed on the upper surface of second silicon carbide semiconductor layer except for gate insulating film 107b and channel removed region 106r. Gate electrode 108 is formed on gate insulating film 107a. Gate electrode 108 is located above at least channel region 106c.

Interlayer insulating film 111 is formed to cover gate electrode 108, and upper electrode 112 is formed on interlayer insulating film 111. Upper electrode 112 is connected to source electrode 109 through contact hole 111c formed on interlayer insulating film 111. Drain electrode 110 is formed on the back surface of semiconductor substrate 101. Back electrode 113 is further formed on drain electrode 110.

Figure 2A:
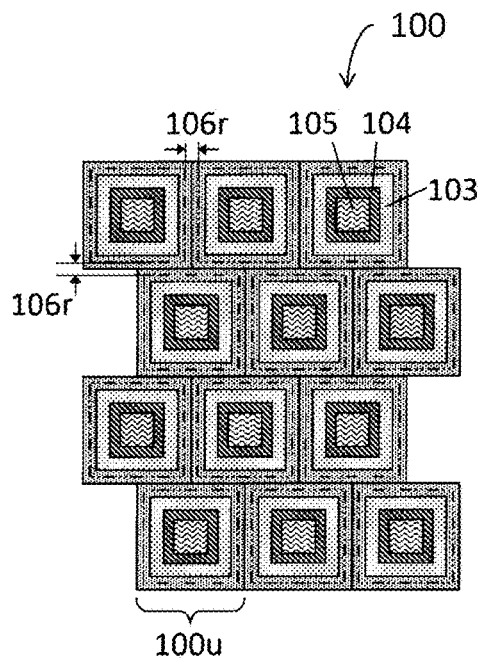
FIG. 2A is a schematic plan view of the silicon carbide semiconductor element according to the first exemplary embodiment.
Figure 2C:
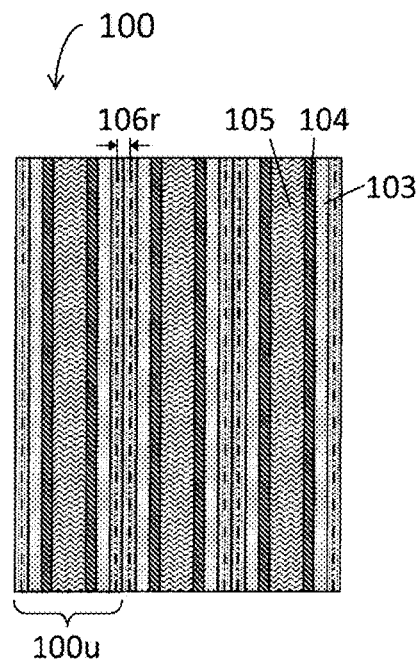
FIG. 2B is a schematic plan view of the silicon carbide semiconductor element according to the first exemplary embodiment.
FIG. 2-C is a schematic plan view of the silicon carbide semiconductor element according to the first exemplary embodiment.
Figure 2B:
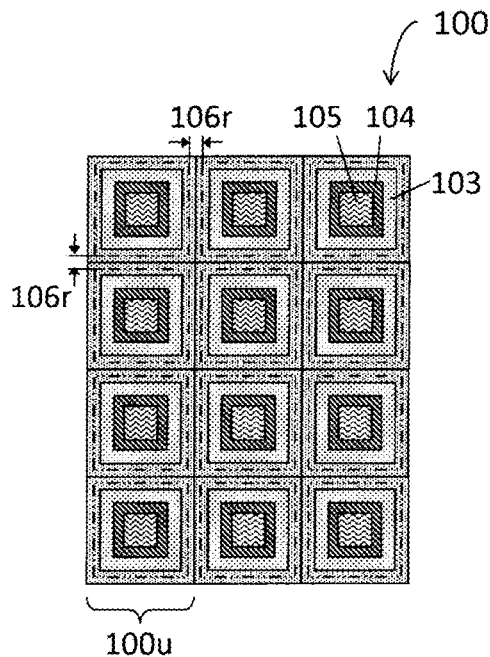

Each unit cell 100u of silicon carbide semiconductor element 100 has a square shape, for example, in a planar view, that is, when silicon carbide semiconductor element 100 is viewed from the side of tipper electrode 112. Alternatively, unit cell 100u may also have a rectangular shape, a quadrilateral shape or any other polygonal shape as well. FIGS. 2A, 2B, and 2C are cross-sectional views on a plane passing through JFET region 102j, body region 103, source region 104, and contact region 105 in FIG. 1 in a planar view. Note that channel removed region 106r is indicated by a two-dot chain line. FIG. 2A illustrates the arrangement of unit cells 100u. As illustrated in FIG. 2A, unit cells 100u are arranged two-dimensionally in x and y directions, and rows of unit cells shift alternately by a half pitch in the y direction. In FIG. 2B as well, unit cells 100u are arranged two-dimensionally in x and y directions, but in this case, rows of unit cells are not shifted in the y direction. If unit cells 100u have a shape that is elongated in one direction, then unit cells 100u may also be arranged in parallel as illustrated in FIG. 2C. In any arrangement, channel removed region 106r is formed along the entire perimeter of unit cell 100u in a planar view. Silicon carbide semiconductor element 100 is formed by a plurality of unit cells 100u that is arranged in this manner.

(Operation and Effect, of Silicon Carbide Semiconductor Element 100)

The operation of silicon carbide semiconductor element 100 will be described next. In silicon carbide semiconductor element 100, second silicon carbide semiconductor layer 106, gate electrode 108 that controls a current flowing through second, silicon carbide semiconductor layer 106, gate insulating film 107, and source electrode 100 and drain electrode 110 which are electrically connected to second silicon carbide semiconductor layer 106 together form, a MOSFET.

Supposing the threshold voltage of the MOSFET (i.e., the threshold voltage of the forward current) is Vth, the MOSFET turns ON if Vgs≥Vth is satisfied, and a conduction path through which carriers can flow is formed on the uppermost surface of second silicon carbide semiconductor layer (channel layer) 106. If Vds>0 V in this case, a current flows from drain electrode 110 to source electrode 109 through semiconductor substrate 101, drift region 102d, JFET region 102j, second silicon carbide semiconductor layer 106, and source region 104.

Generally, gate insulating film 107 of MOSFET using SiC is made of SiO$_2$ film formed by oxidizing the surface of first silicon carbide semiconductor layer 102 or second silicon carbide semiconductor layer 106. It has been known that the formation of an interface having a controlled interface state, such as Si/SiO$_2$ interface, is extremely difficult. In this case, controlling an interface state indicates reducing an interface state density. In the case of Vgs≥Vth, a lot of interface states present on the SiC/SiO$_2$ interface trap charge carriers and charge them negatively. Therefore, the interface states become a source for Coulomb scattering of charge carriers flowing through upper layer 106a, causing an increase in on resistance and conduction loss. However, when second silicon carbide semiconductor layer 106 is highly doped as in silicon, carbide semiconductor element 100 according to the present exemplary embodiment, carriers flow through second silicon carbide semiconductor layer 106 which is hardly affected by the interface, and thus, the reduction in on resistance and reduction in conduction loss are expected.

Figure 3A:
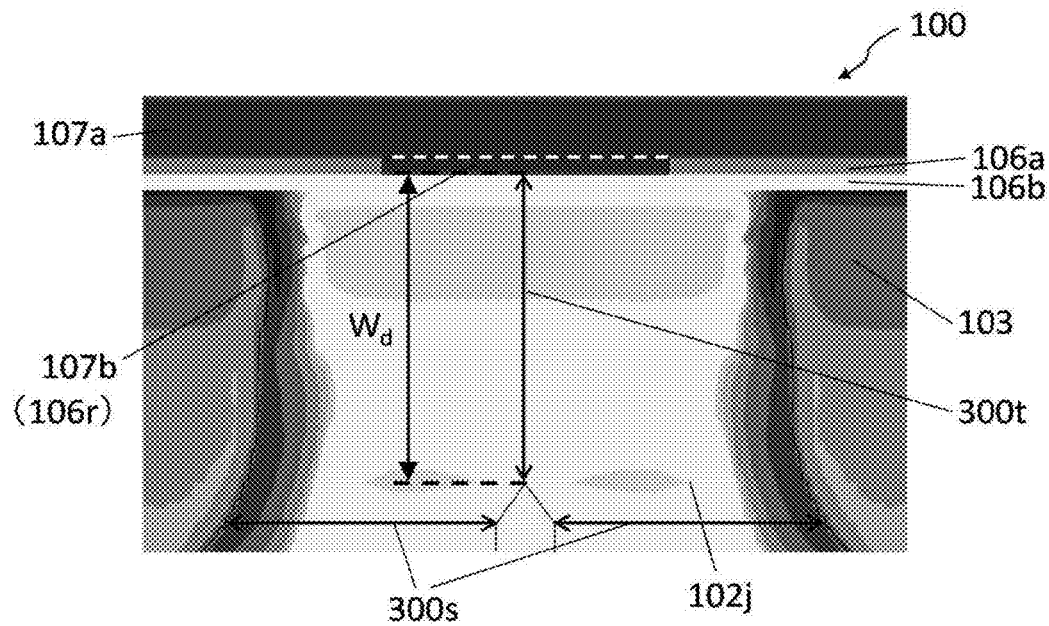
FIG. 3A is a schematic view illustrating how a depletion layer spreads in a JFET region in the silicon carbide semiconductor element according to the first exemplary embodiment.
Figure 3B:
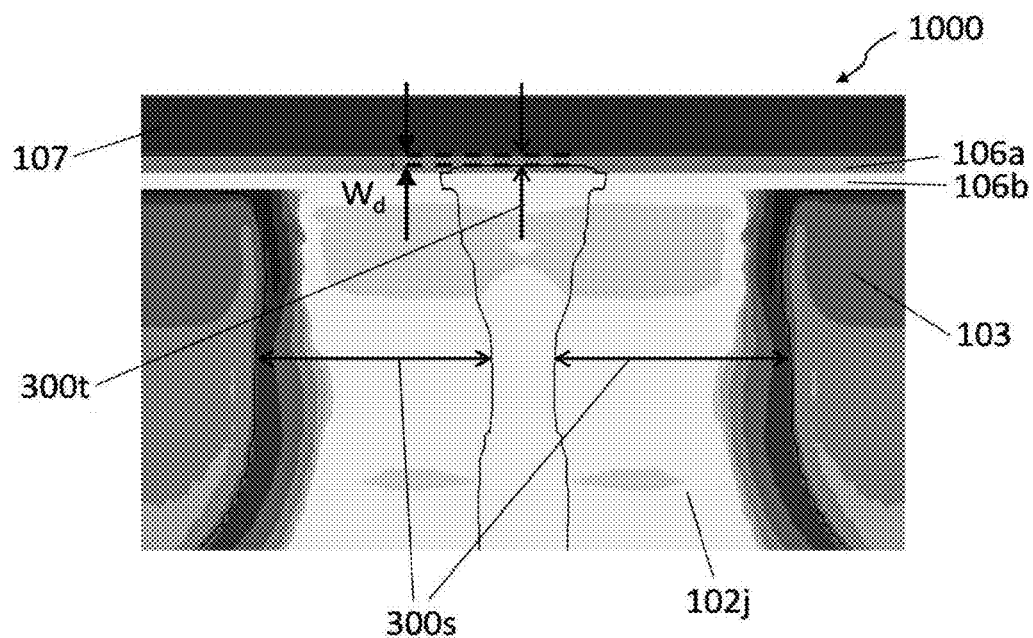
FIG. 3B is a schematic view illustrating how a depletion layer spreads in a JFET region in a silicon carbide semiconductor element according to a comparative example.

On the other hand, in the case of Vgs<Vth, the conduction path which has been formed in second silicon carbide semiconductor layer 106 is eliminated due to the depletion, and therefore, the MOSFET is in an off state. FIGS. 3A and 3B are schematic views illustrating the portion near JFET region 102j when the MOSFET is in the off state (Vgs<Vth) and a voltage of Vds=10 V is applied to drain electrode 110. The schematic views in FIGS. 3A and 3B correspond respectively to silicon carbide semiconductor element 100 according to the present exemplary embodiment and silicon carbide semiconductor element 1000 according to a comparative example. In both elements, when the MOSFET is off a positive voltage (e.g., Vds=10 V in FIGS. 3A and 3B) is applied to drain electrode 110, and therefore, depletion layer 300s spreads toward the central part of JFET region 102j from the border between body region 103 and JFET region 102j as a starting point. In this case, the depletion layer includes depletion layer 300s spreading from left and right body regions 103 adjacent to each other, and depletion layer 300t spreading from gate insulating film 107 toward semiconductor substrate 101. Note that, in FIGS. 3A and 3B, the distance from gate insulating film 107 to the end of depletion layer 300t spreading toward semiconductor substrate 101 is defined as Wd.

If the MOSFET is an ideal electric switch not including parasitic capacitance, a switching time (hereinafter referred to as "mirror period") from on to off (turn-off) or from off to on (turn-on) can be significantly reduced, which enables suppression of switching loss. However, silicon carbide semiconductor element 100 in the present exemplary embodiment and silicon carbide semiconductor element 1000 in the comparative example have parasitic capacitance between terminals, and particularly, the length of the mirror period is determined by the gate-drain capacitance. Therefore, it is important how to reduce the gate-drain capacitance. Specifically, the smaller the gate-drain capacitance becomes, the shorter the mirror period required to charge/discharge charge carriers becomes, and an increase in the switching loss can be prevented.

Hereinafter, two parameters determining the gate-drain capacitance in the MOSFET will be described. One of them is the thickness of gate insulating film 107 formed on JFET region 102j. The other is the length of depletion layer 300t extending toward semiconductor substrate 101 from just below gate insulating film 107, that is, the size Wd in FIGS. 3A and 3B. Supposing that the thickness of gate insulating film 107 is Tox, and dielectric constants of gate insulating film 107 and silicon carbide are ∈ox and ∈SiC respectively, the gate-drain capacitance (Cgd) per unit area can be defined as described below.

$$Cgd=1/[(Tox/\in ox)+(Wd/\in SiC)]$$

As apparent from the above equation, considerable effective measures to reduce the gate-drain capacitance include increasing the width of depletion layer 300t extending from gate insulating film 107 and increasing the thickness of gate insulating film 107. In the present exemplary embodiment, these measures are simultaneously performed to reduce the gate-drain capacitance. Increasing the width of depletion layer 300t indicates that the width of depletion layer 300t in the depth direction, i.e., the width in the vertical direction in FIGS. 3A and 3B, are to be increased. The reduction in dielectric constants of various materials, such as ∈ox and ∈SiC, also leads to the reduction in the gate-drain capacitance. However, since the present exemplary embodiment just relates to a semiconductor element using SiC, the description therefor will be omitted.

FIGS. 3A and 3B illustrate how the spread (length of Wd) of depletion layer 300t is different between silicon carbide semiconductor element 100 in the present exemplary embodiment and silicon carbide semiconductor element 1000 in the comparative example. In silicon carbide semiconductor element 100, as described above, at least upper layer 106a having a high dopant concentration in second silicon carbide semiconductor layer 106 is removed from channel removed region 106r. On the other hand, in silicon carbide semiconductor element 1000, upper layer 106a having a high dopant concentration is not at all removed but remains above JFET region 102j. The region (for example, upper layer 106a) having a high dopant concentration includes a lot of carriers as compared to the region having a low dopant concentration. Therefore, charging/discharging of the carriers is difficult to proceed, and the spread of depletion layer 300t is limitative even in the state in which a voltage is applied to drain electrode 110. In other words, upper layer 106a in second silicon carbide semiconductor layer 106 which is formed for the purpose of reducing on resistance and conduction loss becomes the cause of the increase in the gate-drain capacitance.

The phenomenon described above is obvious from silicon carbide semiconductor element 1000 in the comparative example illustrated in FIG. 3B in which depletion layer 300t does not spread below upper layer 106a of second silicon carbide semiconductor layer 106. On the other hand, in silicon carbide semiconductor element 100 in the present exemplary embodiment illustrated in FIG. 3A, depletion layer 300t is easy to spread due to the absence of region having a high dopant concentration below gate insulating film 107, and therefore, Wd is larger than that in the comparative example. In addition, second silicon carbide semiconductor layer 106 formed in channel removed region 106r is substituted by gate insulating film 107b. Accordingly, the thickness (Tox) of gate insulating film 107 in channel removed region 106r, that is, the total of the thickness of gate insulating film 107a and the thickness of gate insulating film 107b can be made larger than the thickness of gate insulating film 107a formed on second silicon carbide semiconductor layer 106 other than channel removed region 106r. Consequently, the gate-drain capacitance can be significantly reduced due to the synergy effect of increasing the width of depletion layer 300t and partially increasing the thickness of gate insulating film 107.

While JFET region 102j is formed to have a high concentration in silicon carbide semiconductor element 100 according to the present exemplary embodiment illustrated in FIG. 3A, it is understood that the spread of depletion layer 300t is not suppressed by the dopant concentration of JFET region 102j which has a high concentration. Therefore, to attain the purpose of reducing the gate-drain capacitance, it is only necessary that, in second silicon carbide semiconductor layer 106 included in channel removed region 106r, at least the region having a higher dopant concentration than high-concentration JFET region 102j is removed. That is, in the present exemplary embodiment, the region which should be removed is only upper layer 106a having a dopant concentration higher than the dopant concentration of high-concentration JFET region. 102j. It should be noted that, in the case where the dopant concentration is continuously changed in second silicon carbide semiconductor layer 106, the effect of reducing the capacitance can be observed if only at least the region having a dopant concentration higher than the dopant concentration of high-concentration JFET region 102j is removed.

In the present exemplary embodiment, entire of or a part of low-concentration lower layer 106b may be removed, besides high-concentration upper layer 106a which should be removed. In the case in which only upper layer 106a is removed and there is variation in the channel removal depth among unit cells 100u, the intensity of an electric field applied to gate insulating film 107 on JFET region 102j is likely to vary in an off state, which causes a decrease in breakdown voltage. On the other hand, in the case in which channel removed region 106r is formed to be deep enough to reach lower layer 106b as in the present exemplary embodiment, the variation in the intensity of the electric field applied to gate insulating film 107 can be suppressed even if there is variation in the depth of channel removed regions 106r among unit cells 100u. This is because the degree of influence on device characteristics can relatively be reduced in the case in which there is variation with respect to the region (lower layer 106b) having a low dopant concentration as compared to the casein which there is variation with respect to the region (upper layer 106a) having a high dopant concentration.

Figure 4A:
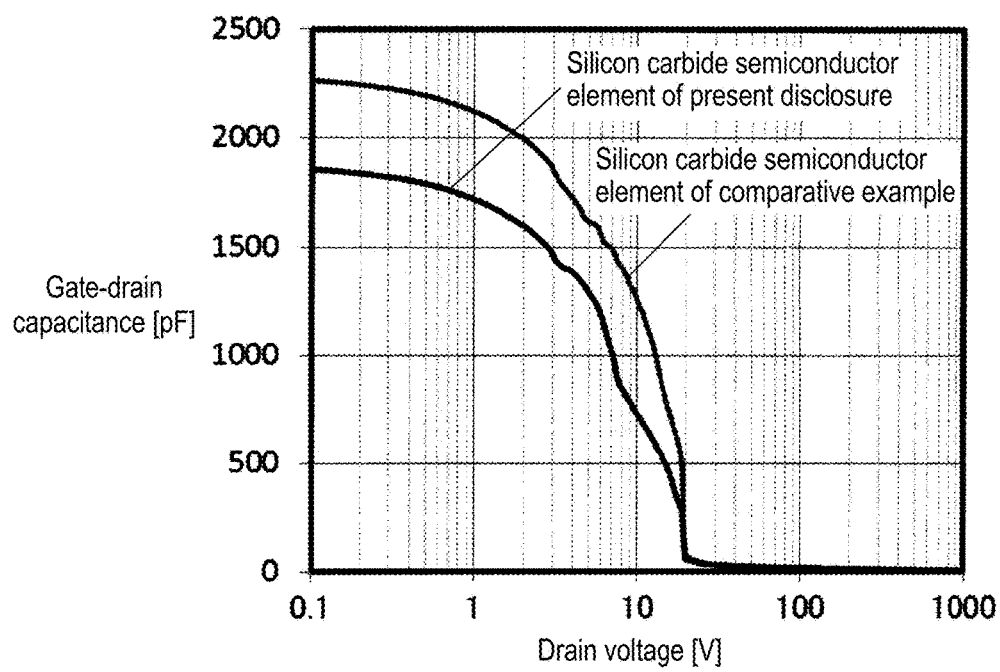
FIG. 4A is a graph in which a relation between gate-drain capacitance and a drain voltage is compared, between the silicon carbide semiconductor element according to the first exemplary embodiment and a silicon carbide semiconductor element having a conventional structure.

FIG. 4A illustrates the result obtained by calculating, by simulation, dependency of gate-drain capacitance to drain voltage in each of silicon carbide semiconductor element 100 in the present exemplary embodiment and silicon carbide semiconductor element 1000 in the comparative example. Note that, in silicon carbide semiconductor element 100 in the present exemplary embodiment illustrated in FIG. 4A, the width of channel removed region 106r (channel removed width 106d) is set as 0.5 μm.

Firstly, it is found that the gate-drain capacitance is decreased with the increase in the drain voltage in both of silicon carbide semiconductor elements 100 and 1000. This is because depletion layer 300s or 300t spreads with the increase in the drain voltage. In addition, around Vds=20 V, the gate-drain capacitance is rapidly decreased, because depletion layers 300s spreading from left and right body regions 103 adjacent to JFET region 102j are combined to each other. The absolute value of the gate-drain capacitance and how the value is changed after the rapid reduction in the gate-drain capacitance (Vds>20 V) are uniquely derived on the basis of the concentrations of body region 103 and drift region 102d. Therefore, they are equivalent between silicon carbide semiconductor elements 100 and 1000 which are the same in the concentrations of these regions. Accordingly, the effect of reducing the capacitance in the present exemplary embodiment is particularly the most significant in the region where the drain voltage is low (in this case, Vds<20 V) before the rapid reduction in the gate-drain capacitance.

Figure 4B:
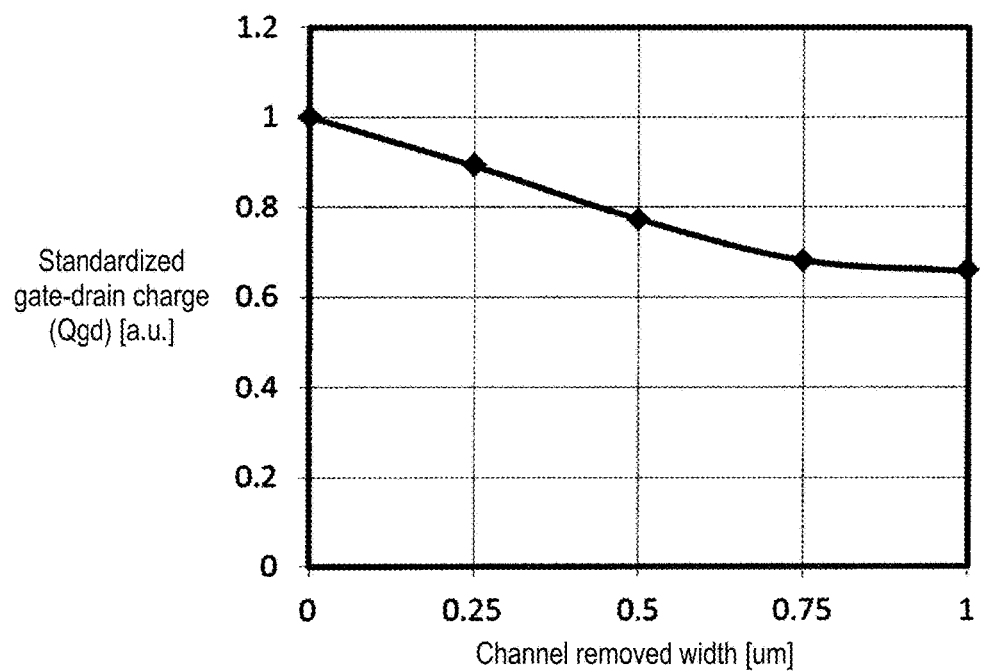
FIG. 4B is a graph illustrating a relation between gate-drain charge amount and a width of a channel removed region in the silicon carbide semiconductor element according to the first exemplary embodiment.

FIG. 4B illustrates dependency of an amount of gate charges (Qgd) which should be charged and discharged during a mirror period on channel removed width Wd. Qgd is defined as described below using gate-drain capacitance (Cgd).

$$Qgd = \int (Cgd) dVds$$

The interval, of the above integration is almost from an on voltage to a power supply voltage. The on voltage herein is determined by the product of the resistance (hereinafter referred to as "on resistance") and a load current IL in the on state of silicon carbide semiconductor element 100, and it is about 1 to 10 V when the on resistance of silicon carbide semiconductor element 100 is low such as 100 mΩ or lower. On the other hand, although different from the usage of silicon carbide semiconductor element 100, a power supply voltage in a high breakdown voltage region of 600 V or more is generally used for a semiconductor element using SiC. Accordingly, every time the MOSFET repeats the switching of turn-on and turn-off, charging/discharging of the gate-drain capacitance is required within such large voltage range, and the total amount of charges which are to be charged and discharged in switching is defined by the Qgd.

The larger the Qgd is, the more the switching time is increased, and thus, the switching loss is increased. Therefore, Qgd is desirably minimized. FIG. 4B illustrates the dependency of Qgd on the channel removed width as described above, and Qgd is standardized with respect the value at which the channel removed width is 0 μm. The configuration in which channel removed width 106d is 0 μm is the same as the configuration of silicon carbide semiconductor element 1000 in the comparative example. It is found from FIG. 4B that Qgd is monotonically decreased by increasing the channel removed width. Therefore, from the viewpoint of reducing the switching loss, it can be said that the wider channel removed width 106d is, the better it is.

However, it is assumed that increasing channel removed width 106d without any consideration adversely affects current-voltage characteristics. This is because, if channel removed width 106d is equal to or larger than the width of JFET region 102j, second silicon carbide semiconductor layer 106 is electrically isolated from JFET region 102j, which increases the resistance in channel region 106c, as previously described.

Figure 5A:
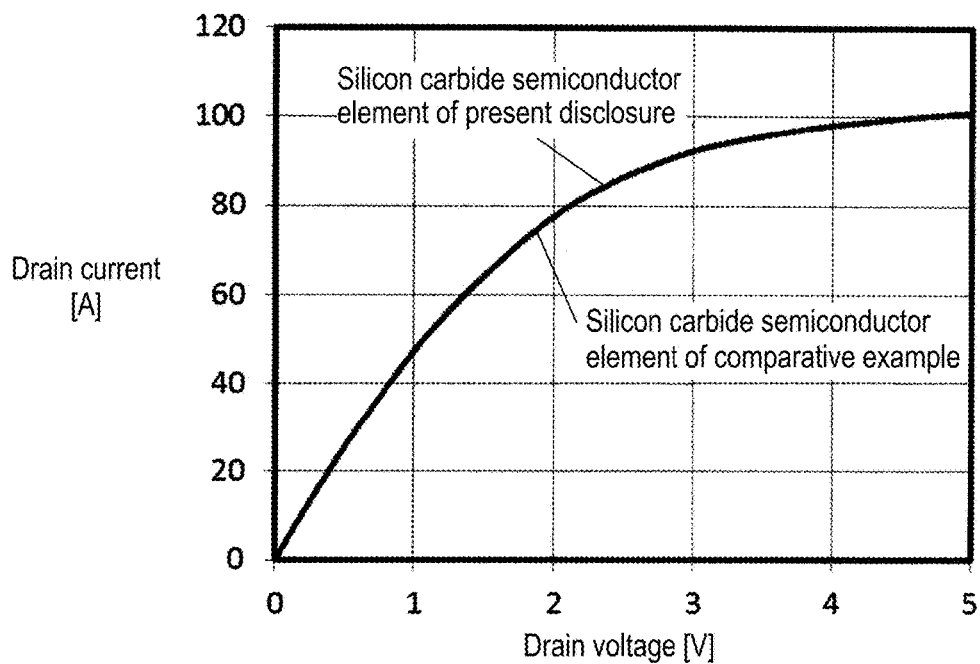
FIG. 5A is a graph in which a relation between a drain current and a drain voltage is compared between the silicon carbide semiconductor element according to the first exemplary embodiment and the silicon carbide semiconductor element according to the comparative example.
Figure 5B:
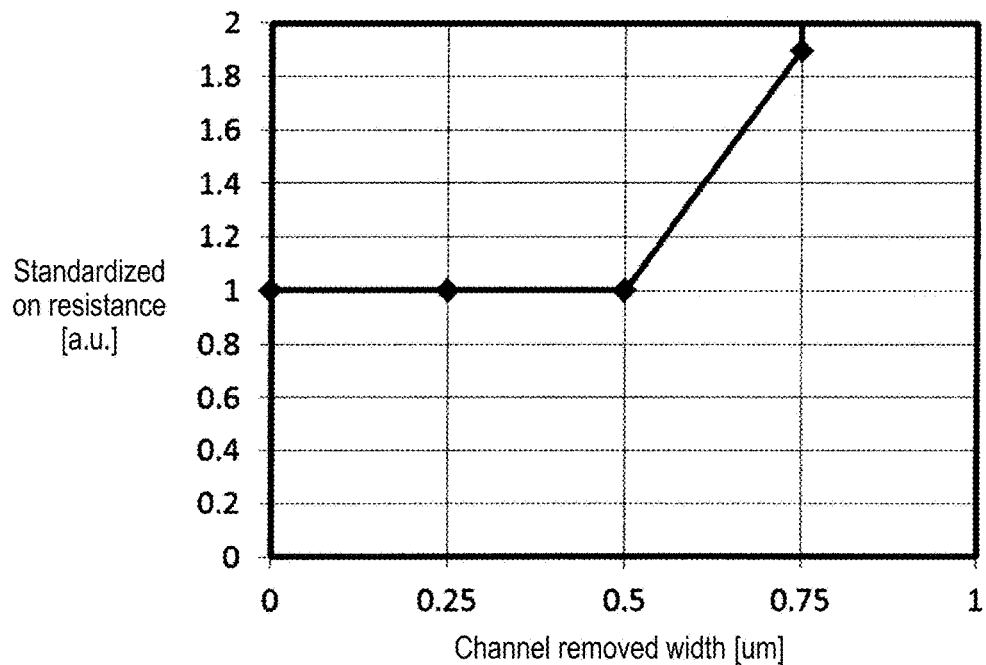
FIG. 5B is a graph illustrating a relation between on resistance and a width of a channel removed region in the silicon carbide semiconductor element according to the first exemplary embodiment.

The result obtained by calculating the effect of the channel removed width on the current-voltage characteristics is illustrated in FIGS. 5A and 5B. In silicon carbide semiconductor element 100 in the present exemplary embodiment illustrated in FIG. 5A, the width of channel removed region 106r (channel removed width 106d) is set as 0.5 μm. As is understood from FIG. 5A, the effect of channel removed width 106d on the current-voltage characteristics is considered to be limitative, if channel removed width 106d is 0.5 μm or lower, for example. In addition, FIG. 5B illustrates the dependency of on resistance on channel removed width 106d. As in FIG. 4B, the configuration in which channel removed width 106d is 0 μm is the same as the configuration of silicon carbide semiconductor element 1000 in the comparative example, and the on resistance in this configuration is used as 1 for standardization. As illustrated in FIG. 5B, the on resistance is significantly increased in the region where channel removed width 106d is larger than 0.5 μm. This suggests that, in second silicon carbide semiconductor layer 106, second silicon carbide semiconductor layer 106 on JFET region 102j located within 0.25 μm from the center of JFET region 102j in the horizontal direction does not function as the conduction path for carriers, while second silicon carbide semiconductor layer 106 on JFET region 102j located within 0.25 μm from both ends of JFET region 102j toward the inside of JFET region 102j functions as the conduction path for carriers. Therefore, second silicon carbide semiconductor layer 106 which is located within 0.25 μm from both ends of JFET region 102j toward the inside and is required as the conduction path for carriers should be excluded from channel removed region 106r.

In silicon carbide semiconductor element 100 in the present exemplary embodiment, the width of JFET region 102j is set as 1 μm. Notably, if the width of JFET region 102j is Wj (μm), Wr (μm) which is channel removed width 106d satisfies the following condition.

$$Wr \leq Wj - 0.25 \ \mu m \times 2$$

The numerical value 0.25 μm is the width that should be ensured as the conduction path for carriers on the end of JFET region 102j as previously described, and this value is doubled so that this region exists on both ends of JFET region 102j. In addition, in order to obtain positive Wr, width Wj of JFET region 102j needs to satisfy the condition of:

$$Wj > 0.5 \ \mu m$$

As described above, silicon carbide semiconductor element 100 according to the present exemplary embodiment includes channel removed region 106r, thereby being capable of accelerating the spread of depletion layer 300t spreading below gate insulating film 10 to reduce the gate-drain capacitance. Furthermore, silicon carbide semiconductor element 100 can suppress the increase in the on resistance by setting width Wr (μm) of channel removed region 106r and width. Wj (μm) of JFET region 102j to satisfy Wr ≤ (Wj−0.25 μm×2) and Wj>0.5 μm. As described above, according to the present exemplary embodiment, silicon carbide semiconductor element 100 that can simultaneously implement the reduction in the conduction loss due to the introduction of the channel layer and the reduction in the switching loss due to the reduction in the gate-drain capacitance can be provided.

(Method for Manufacturing Silicon Carbide Semiconductor Element 100)

Next, one example of a method for manufacturing silicon carbide semiconductor element 100 according to the present exemplary embodiment will be described in detail with reference to FIGS. 6A to 6P. Note that specific numerical values, materials and process conditions described below are only illustrative.

Firstly, semiconductor substrate 101 is prepared. For example, semiconductor substrate 101 is an n type 4H-SiC off-cut substrate having low resistance (resistivity 0.02 Ωcm).

Figure 6A:
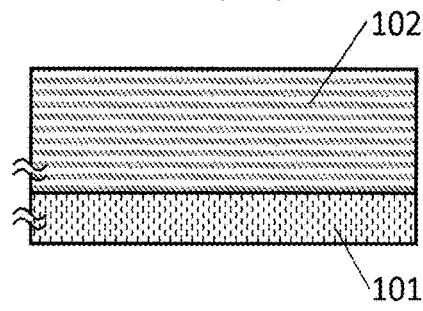
FIG. 6A is a cross-sectional view illustrating a method for manufacturing the silicon carbide semiconductor element according to the first exemplary embodiment.

As illustrated in FIG. 6A, a process for forming first silicon carbide semiconductor layer 102 on the surface of semiconductor substrate. 101 is performed. Specifically, high-resistance first silicon carbide semiconductor layer 102 is epitaxially grown on semiconductor substrate 101. Before the formation of first silicon carbide semiconductor layer 102, a buffer layer composed of SiC having a high concentration of n type dopant may be deposited on semiconductor substrate 101. The dopant concentration of the buffer layer is $1 \times 10^{18}$ cm$^{-3}$, and the thickness of the buffer layer is 1 μm, for example. First silicon carbide semiconductor layer 102 is composed of n type 4H-SiC, and its dopant concentration and thickness are $1 \times 10^{16}$ cm$^{-3}$ and 10 μm, for example.

Figure 6E:
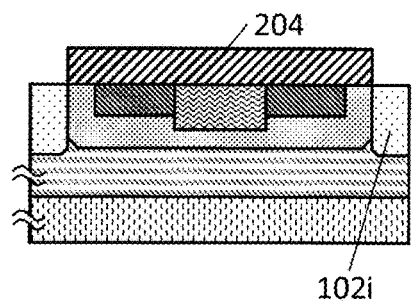
FIG. 6E is a cross-sectional view illustrating the method for manufacturing the silicon/carbide semiconductor element according to the first exemplary embodiment.
Figure 6B:
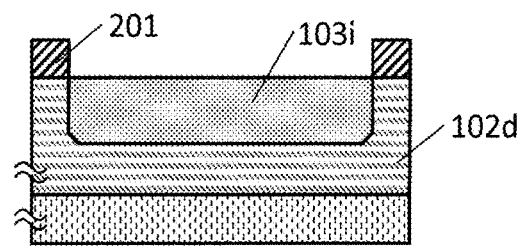
FIG. 6B is a cross-sectional view illustrating the method for manufacturing the silicon carbide semiconductor element according to the first exemplary embodiment.

Next, a process for forming the body region is performed as illustrated in FIG. 6B. Specifically, mask 201 formed from SiO$_2$, for example, is formed on first silicon carbide semiconductor layer 102, and Al (aluminum) ions, for example, are implanted into first silicon carbide semiconductor layer 102 to form body implanted region 103i. Body implanted region 103i will be body region 103 after the activation of the implanted ions. The rest of first silicon carbide semiconductor layer 102 other than body region 103 will be drift region 102d. Preferably, the concentration or thickness of body region 103 is determined so as not to cause a punch-through phenomenon between source region 104 and drift region 102d when silicon carbide semiconductor element 100 has a desired breakdown voltage.

Figure 6C:
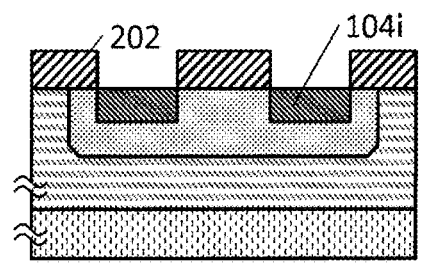
FIG. 6C is a cross-sectional view illustrating the method for manufacturing the silicon carbide semiconductor element according to the first exemplary embodiment.

As illustrated in FIG. 6C, mask 201 is removed after the ion implantation, and then, a process for forming the source electrode is performed. Specifically, nitrogen ions, for example, are implanted into body implanted region 103i using mask 202 to form source implanted region 104i. Mask 202 may be formed by forming a side-wall mask of mask 201 with a part of mask 201 being left (that is, a so-called "self-aligning process" for self-aligning source implanted region 104i with respect to body implanted region 103i may be applied as well).

Figure 6D:
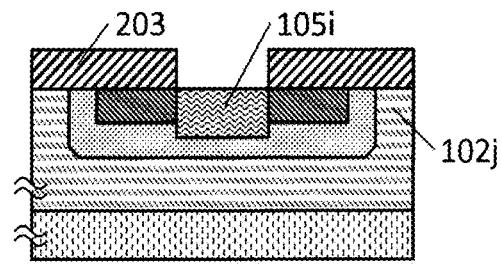
FIG. 6D is a cross-sectional view illustrating the method for manufacturing the silicon carbide semiconductor element according to the first exemplary embodiment.

After the ion implantation, mask 202 is removed, and as illustrated in FIG. 6D, Al is implanted after the formation of mask 203, to form contact implanted region 105i. In this case, it is preferable that contact implanted region 105i be formed to be deeper than source implanted region 104i.

Next, mask 203 is removed, and then, JFET implanted region 102i of the first conductivity type illustrated in FIG. 6E is formed to cover JFET region 102j by using mask 204 as viewed from top of semiconductor substrate 101. JFET implanted region 102i is formed by implanting N ions, for example. In the present exemplary embodiment, JFET implanted region 102*i* is formed to be deeper than body implanted region 103*i* from the surface of first silicon carbide semiconductor layer 102 in the vertical direction of semiconductor substrate 101. In addition, the dopant concentration of JFET implanted region 102*i* in the ion implantation is larger than the dopant concentration of drift region 102*d*. In the present exemplary embodiment, the average dopant concentration of JFET implanted region 102*i* is set to be about $5 \times 10^{16}$ cm$^{-8}$.

Figure 6F:
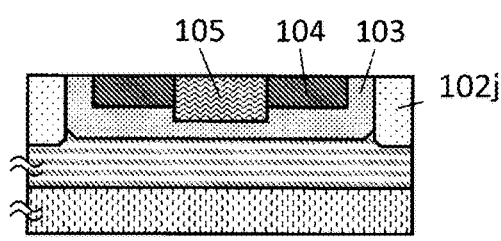
FIG. 6F is a cross-sectional view illustrating the method for manufacturing the silicon carbide semiconductor element according to the first exemplary embodiment.

After these ions have been implanted, mask 204 is removed, and then, a high-temperature heat treatment (annealing for activation) for activating the dopants implanted into first silicon carbide semiconductor layer 102 is performed, whereby body region 103, source region 104, contact region 105, and high-concentration JFET region 102*j* are formed as illustrated in FIG. 6F. The ion implantation profile is adjusted such that body region 103 has the depth of about 600 nm and the average dopant concentration of from about $1 \times 10^{18}$ cm$^{-3}$ to $1 \times 10^{19}$ cm$^{-3}$. The ion implantation profile is adjusted such that source region 104 has the depth of about 250 nm and the average dopant concentration of about $5 \times 10^{19}$ cm$^{-3}$. In this case, the depth of body region 103 is supposed to be a depth at which a dopant concentration of $1 \times 10^{16}$ cm$^{-3}$, which is equal to the dopant concentration of first silicon carbide semiconductor layer 102, is achieved. In addition, the depth of source region 104 is supposed to be a depth at which the average dopant concentration of body region 103 is achieved, for example. Furthermore, the depth of high-concentration JFET region 102*j* is also supposed to be a depth at which a dopant concentration of $1 \times 10^{16}$ cm$^{-3}$, which is equal to the dopant concentration of first silicon carbide semiconductor layer 102, is achieved, as in the depth of body region 103.

Contact region 105 has the depth of 400 nm and the average dopant concentration of about $1 \times 10^{20}$ cm$^{-3}$. The depth thereof is supposed to be a depth at which the average dopant concentration of body region 103 is achieved, fox example. It should be noted that in order to clean the surface of first silicon carbide semiconductor layer 102 that has been subjected to annealing for activation, a surface portion of first silicon carbide semiconductor layer 102 is sometimes removed. For example, if a surface portion of first silicon carbide semiconductor layer 102 has been removed to a depth of 50 nm, the respective depths of body region 103, source region 104, and contact region 105 will all decrease by about 50 nm to be 550 nm, 200 nm, and 350 nm, respectively.

Figure 6G:
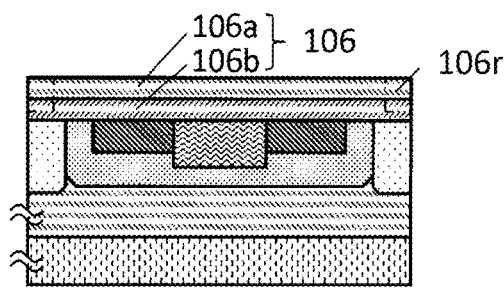
FIG. 6G is a cross-sectional view illustrating the method for manufacturing the silicon carbide semiconductor element according to the first exemplary embodiment.

Next, a process for forming second silicon carbide semiconductor layer 106 is performed as illustrated in FIG. 6G. Specifically, second silicon carbide semiconductor layer 106 is epitaxially grown on the entire surface of first silicon carbide semiconductor layer 102 including JFET region 102*j*, body region 103, source region 104, and contact region 105. Second silicon carbide semiconductor layer 106 includes upper layer 106*a* and lower layer 106*b* as described previously. In the present exemplary embodiment, lower layer 106*b* is formed, and subsequently, upper layer 106*a* is formed. It should be noted that, after lower layer 106*b* of second silicon carbide semiconductor layer 106 has been formed, the epitaxial growth may be stopped, and after a certain time interval, the epitaxial growth may be added to form upper layer 106*a*. Since lower layer 106*b* is undoped, the dopant concentration is ideally $1 \times 10^{16}$ cm$^{-3}$ or lower, but due to the influence of residual nitrogen or the like in an epitaxial growth device, the dopant concentration may be $2 \times 10^{16}$ cm$^{-3}$ in some cases. The thickness of lower layer 106*b* is 26 nm, for example. After lower layer 106*b* has been formed, nitrogen is introduced in the form of a doping gas, by which upper layer 106*a* is formed. The dopant concentration and final thickness of upper layer 106*a* are $2 \times 10^{18}$ cm$^{-3}$ and 24 nm, for example. However, since a part thereof is removed from the outermost surface by oxidation in the later process for forming a gate insulating film, upper layer 106*a* is formed to have a thickness larger than the target thickness (e.g., 24 nm). If an insulating film is to be deposited separately as gate insulating film 107, upper layer 106*a* is formed to have the target thickness of 24 nm.

Figure 6H:
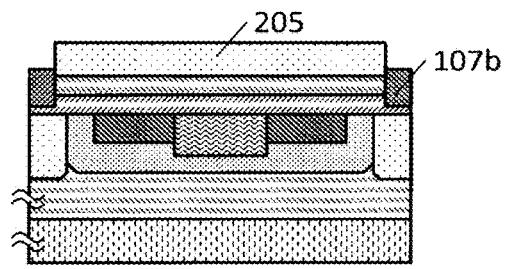
FIG. 6H is a cross-sectional view illustrating the method for manufacturing the silicon carbide semiconductor element according to the first exemplary embodiment.

After second silicon carbide semiconductor layer 106 has been formed, mask 205 composed of silicon nitride (SiN), for example, is formed so as to expose the region which is later to be channel removed region 106*r* illustrated in FIG. 6G (note that channel removed region 106*r* illustrated in FIG. 6G is a half of original channel removed region 106*r* in FIG. 1). As illustrated in FIG. 6H, after the formation of mask 205, a process for removing at least a part of second silicon carbide semiconductor layer 106 is performed. For example, at least upper layer 106*a* of the second silicon carbide semiconductor layer included in channel removed region 106*r* is removed by dry etching or thermal oxidation. As previously described, channel removed region 106*r* may include a part or entire of lower layer 106*b*.

Note that thermal oxidation is more preferable than dry etching as the removing process, and three reasons are cited therefor. The first reason is as follows. To remove very thin second silicon carbide semiconductor layer 106, reproducibility and precision in an etching amount are required, and the thermal oxidation provides better reproducibility and precision than the dry etching, as well as provides satisfactory distribution in a wafer plane. The second reason is as follows. When the thermal oxidation for forming gate insulating film 107*a* is performed in the state in which the thermal oxide film (gate insulating film 107*b*) on channel removed region 106*r* formed for removing second silicon carbide semiconductor layer 106 is left, gate insulating film 107 (corresponding to gate insulating film 107*b* illustrated in FIG. 6I described later) in channel removed region 106*r* can be formed to be thicker, as compared to the region other than channel removed region 106*r*, and this leads to the reduction in the gate-drain capacitance. The third reason is such that the removal of second silicon carbide semiconductor layer 106 in channel removed region 106*r* and the formation of gate insulating film 107*b* are simultaneously performed, whereby the number of manufacturing processes is reduced.

Figure 6I:
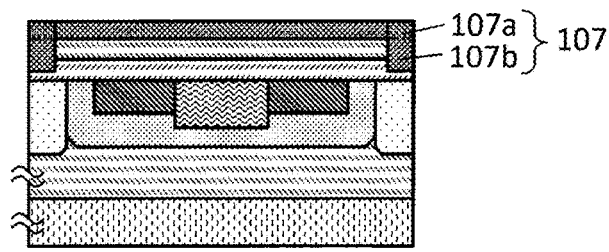
FIG. 6I is a cross-sectional view illustrating the method for manufacturing the silicon carbide semiconductor element according to the first exemplary embodiment.

Next, as illustrated in FIG. 6I, gate insulating film 107*a* is formed on at least the surface of upper layer 106*a* of second silicon carbide semiconductor layer, that is, on the region where second silicon carbide semiconductor layer 106 is not removed, by thermal oxidation. The thickness of gate insulating film 107*b* formed in channel removed region 106*r* illustrated in FIG. 6I is slightly larger by the additional thermal oxidation. As illustrated in FIG. 6I, in the present exemplary embodiment, the thickness of gate insulating film 107*b* formed in channel removed region 106*r* is larger than the thickness of gate insulating film 107*a*, because the thickness of gate insulating film 107*a* is added to the depth of channel removed region 106*r*. When the dry etching is selected to form channel removed region 106*r*, gate insulating film 107*a* is formed on upper layer 106*a* of second silicon carbide semiconductor layer and along the bottom surface of the recess of channel removed region 106*r*. In this case, the thickness of gate insulating film 107 is the same in channel removed region 106*r* and other regions (not illustrated). In addition, in this case, gate insulating film 107*b* formed in channel removed region 106r and gate insulating film 107a are simultaneously formed.

When gate insulating film 107a is formed by thermal oxidation, a part of upper layer 106a of the second silicon carbide semiconductor layer may become gate insulating film 107a. Therefore, in consideration of the thickness lost by the thermal oxidation, the thickness of upper layer 106a of second silicon carbide semiconductor layer 106 to be formed is adjusted to be the target thickness (for example, 24 nm) after the formation of gate insulating film 107a (in the above-described case, upper layer 106a of the second silicon carbide semiconductor layer is formed to have a thickness larger than the target thickness by about 50 nm, and the target thickness is achieved through the cleaning process for upper layer 106a of second silicon carbide semiconductor layer 106 before the formation of the gate insulating film and the process for forming, the gate insulating film). Thereafter, a polycrystalline silicon film to which phosphor is doped in an amount of about $7 \times 10^{20}$ cm$^{-3}$ is deposited on the surface of gate insulating film 107. The thickness of the polycrystalline silicon film is about 500 nm, for example. The polycrystalline silicon film can be deposited using a chemical vapor deposition (CVD) method or an atomic layer deposition (ALD) method.

Figure 6J:
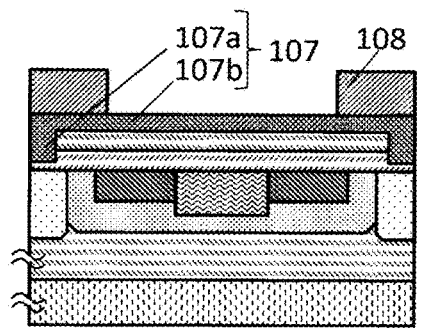
FIG. 6J is a cross-sectional view illustrating the method for manufacturing the silicon carbide semiconductor element according to the first exemplary embodiment.
Figure 6K:
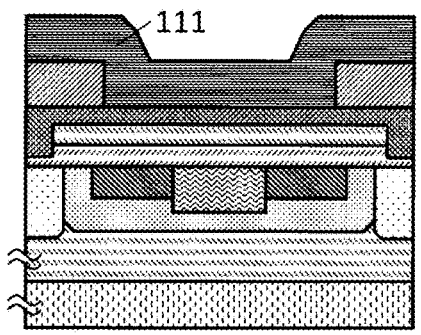
FIG. 6K is a cross-sectional view illustrating the method for manufacturing the silicon carbide semiconductor element according to the first exemplary embodiment.

Next, as illustrated in FIG. 6J, the polycrystalline silicon film is dry etched using a mask (not illustrated), whereby gate electrode 108 is formed on a desired region. Then, as illustrated in FIG. 6K, interlayer insulating film 111 composed of SiO$_2$, for example, is deposited to cover the surface of gate electrode 108 and the surface of first silicon carbide semiconductor layer 102 by a CVD method. The thickness of interlayer insulating film 111 is 1 µm, for example.

Figure 6L:
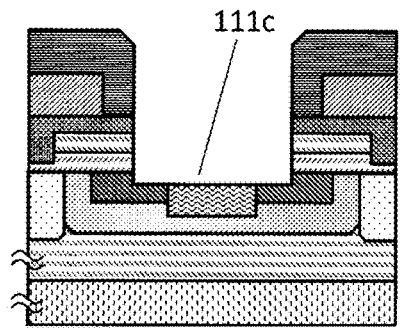
FIG. 6L is a cross-sectional view illustrating the method for the silicon carbide semiconductor element according to the first exemplary embodiment.

Next, as illustrated in FIG. 6L, interlayer insulating film 111 on the surface of contact region 105 and on a part of the surface of source region 104 are removed by dry etching using a mask (not illustrated) to form contact hole 111c.

Figure 6M:
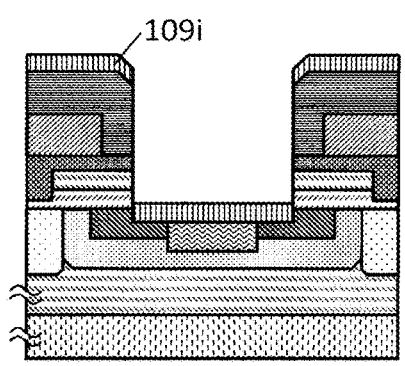
FIG. 6M is a cross-sectional view illustrating the method for manufacturing the silicon carbide semiconductor element according to the first exemplary embodiment.
Figure 6N:
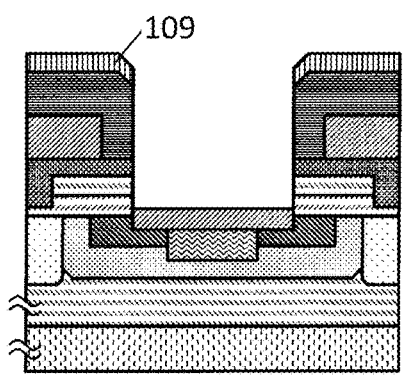
FIG. 6N is a cross-sectional view illustrating the method for manufacturing the silicon carbide semiconductor element according to the first exemplary embodiment.
Figure 6O:
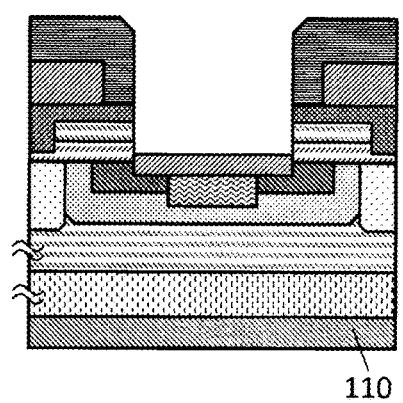
FIG. 6O is a cross-sectional view illustrating the method for manufacturing the silicon carbide semiconductor element according to the first exemplary embodiment.

Thereafter, as illustrated in FIG. 6M, nickel film 109i with a thickness of about 50 nm, for example, is formed on interlayer insulating film 111. With a heat treatment at a temperature of 950° C. for 5 minutes under an inert atmosphere, for example, nickel film 109i is reacted with the surface of silicon carbide to form source electrode 109 composed of nickel silicide, as illustrated in FIG. 6N. Then, as illustrated in FIG. 6O, nickel film 109i on interlayer insulating film 111 is removed by etching, and thereafter, nickel, for example, is also deposited on the entire back surface of semiconductor substrate 101, and the nickel is similarly reacted with the silicon carbide with the heat treatment to form drain electrode 110.

Figure 6P:
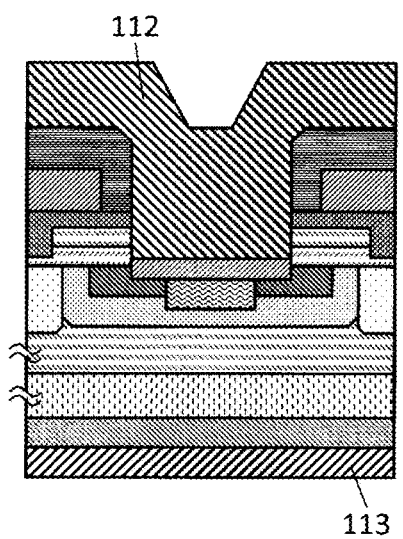
FIG. 6P is a cross-sectional view illustrating the method for manufacturing the silicon carbide semiconductor element according to the first exemplary embodiment.

Subsequently, an aluminum film, with a thickness of about 4 µm is deposited on interlayer insulating film 111 and in contact hole 111c, and the resultant is etched into a desired pattern, whereby upper electrode 112 is formed as illustrated in FIG. 6P. Note that, although not illustrated, a gate wiring (or gate pad) contacting with gate electrode 108 is also formed on the other regions on a chip end. Further, Ti/Ni/Ag is deposited on the back surface of drain electrode 110 as back electrode 113 for die bond, for example (The Ti side is in contact with drain electrode 110). In this way, silicon carbide semiconductor element 100 illustrated in FIG. 1 is obtained.

(Modification of Channel Removed Region 106r)

One example of the planar configuration of unit cells 100u in the present exemplary embodiment has already been illustrated in FIGS. 2A to 2C. According to this configuration, channel removed region 106r is formed along the outer perimeter of unit cell 100u. Besides the configuration illustrated in FIGS. 2A to 2C, channel removed region 106r may be formed along only a part of the outer perimeter of unit cell 100u as illustrated in FIGS. 7A and 7B.

Figure 7A:
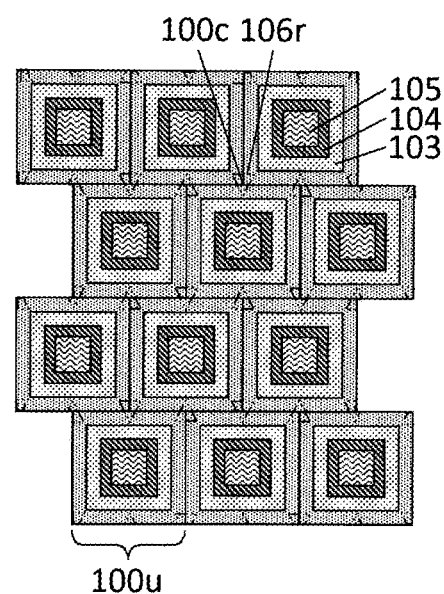
FIG. 7A is a schematic plan view of a silicon carbide semiconductor element according to a modification of the first exemplary embodiment.

For example, as illustrated in FIG. 7A, in the case in which unit cells 100u are arranged two-dimensionally in x and y directions, and rows of unit cells shift alternately by a half pitch in the y direction, channel removed region 106r is formed on a "portion near border" where at least three or more unit cells 100u are in contact with one another. The "portion near border" herein is defined as a region included in, a circle which has a radius obtained by subtracting 0.25 µm for the purpose of ensuring the width of a current path from the distance between center 100c of border and the closest body region 103. Therefore, the region defined as channel removed region 106r is not necessarily circular. According to this configuration, the area where channel removed region 106r is to be formed is decreased in a planar view of unit cells 100u, resulting in that the effect of reducing the gate-drain capacitance is reduced. However, the probability in which, if the position of channel removed region 106r is shifted in unit cell 100u, the on resistance is increased, can be minimized.

Figure 7B:
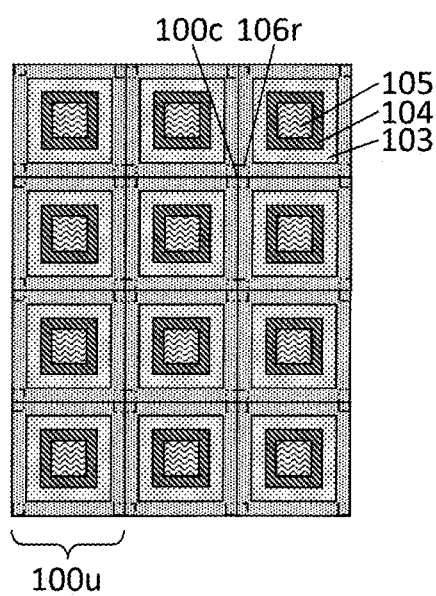
FIG. 7B is a schematic plan view of a silicon carbide semiconductor element according to the modification of the first exemplary embodiment.

Similarly, for example, as illustrated in FIG. 7B, in the case in which unit cells 100u are arranged two-dimensionally in x and y directions, and rows of unit cells do not shift in the y direction, channel removed region 106r is formed on a "portion near border" where at least four or more unit cells 100u are in contact with one another. With this configuration as well, the probability in which, if the position of channel removed region 106r is shifted in unit cell 100u, the on resistance is increased, can be minimized, and further, a margin for production tolerance is increased. Thus, it is more preferable in the light of production.

Second Exemplary Embodiment

Figure 8A:
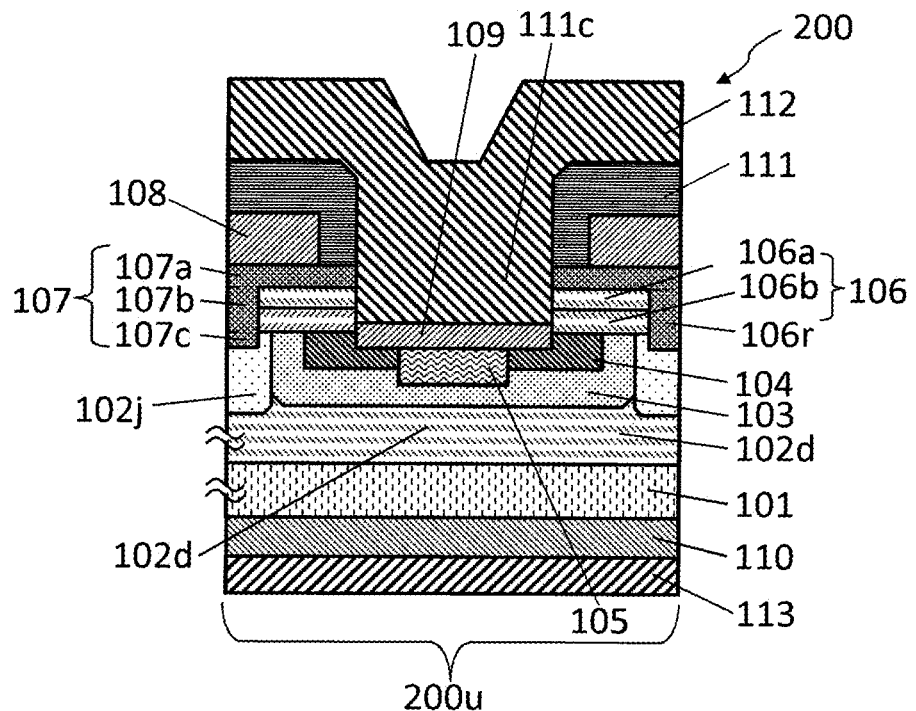
FIG. 8A is a schematic cross sectional view of a silicon carbide semiconductor element according to a second exemplary embodiment.

FIG. 8A schematically illustrates a cross-section of silicon carbide semiconductor element 200 according to the second exemplary embodiment. Silicon carbide semiconductor element 200 includes a plurality of unit cells 200u. In the present second exemplary embodiment, channel removed region 106r is set to be deeper than the first exemplary embodiment. Specifically, while channel removed region 106r in the first exemplary embodiment is a cutout of second silicon carbide semiconductor layer 106, channel removed region 106r in the present second exemplary embodiment includes not only the cutout of second silicon carbide semiconductor layer 106 but also a cutout of JFET region 102j. The cutout of JFET region 102j is extended from the upper surface of JFET region 102j, and is spatially continuous with the cutout of second silicon carbide semiconductor layer 106. Note that the processes other than the channel removing process are similar to those in the first exemplary embodiment. As in the first exemplary embodiment, a dopant of the first conductivity type may be introduced into JFET region 102j at a high concentration.

According to the present second exemplary embodiment, the thickness of gate insulating film 107b formed in channel removed region 106r can further be increased. Therefore, the gate-drain capacitance can further be reduced, whereby the effect of reducing the switching loss is enhanced.

As in the first exemplary embodiment, the surface portions of second silicon carbide semiconductor layer 106 and JFET region 102j present in channel removed region 106r are removed by dry etching or thermal oxidation, for example, in the present second exemplary embodiment. For the sake of simplicity of description, the gate insulating film formed in the region of channel removed region 106r where second silicon carbide semiconductor layer 106 has been present is defined as gate insulating film 107b, and the gate insulating film formed in the region where JFET region 102j has been present is referred to as gate insulating film 107c.

Figure 8B:
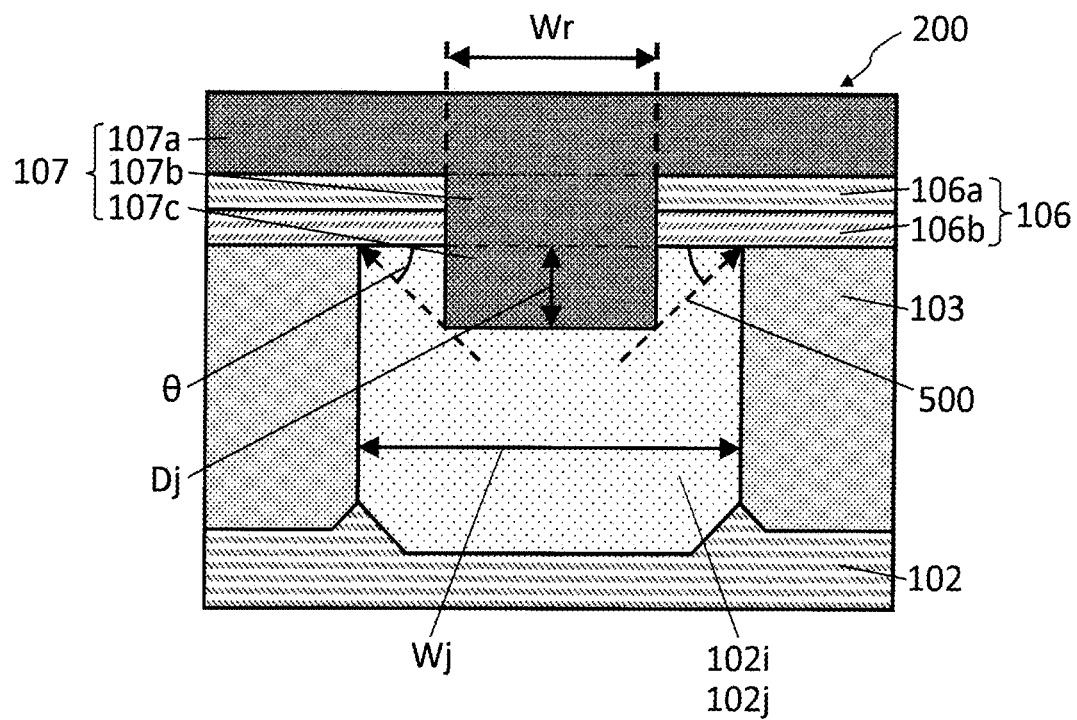
FIG. 8B is a schematic cross-sectional view of the silicon carbide semiconductor element according to the second exemplary embodiment.

FIG. 8B is an enlarged schematic cross-sectional view of a portion near JFET region 102j of silicon carbide semiconductor element 200 according to the present second exemplary embodiment. It is supposed here that the width of JFET region 102j is defined as Wj (μm), the width of channel removed region 106r in the channel removing process is defined as Wr (μm), and the removed depth of the surface portion of JFET 102j in the channel removing process is defined as Dj (μm). According to these definitions, removed depth of the surface portion, of JFET 102j is equal to the thickness of gate insulating film 107c, so that the thickness of gate insulating film 107 in channel removed region 106r is increased by removed depth Dj.

In order to suppress the increase in the on resistance, width Wr of channel removed region 106r is set to satisfy:

$$Wr \leq Wj - 0.25 \, \mu m \times 2$$

as in the first exemplary embodiment.

In addition, the relation of:

$$Wj < 0.5 \, \mu m$$

needs to be satisfied to obtain positive Wr.

In addition, as illustrated in FIG. 8B, current path 500 in JFET region 102j has angle θ with respect to the main surface of first silicon carbide semiconductor layer 102 when being connected to second silicon carbide semiconductor layer 106. When the mobility of carriers in JFET region 102j is almost the same in the direction parallel to the main surface of semiconductor substrate 101 and in the direction perpendicular thereto, angle θ becomes 45°. Therefore, the maximum value of removed depth Dj of the surface portion of JFET 102j needs to be set such that, when angle θ is 45°, channel removed region 106r would not cross current path 500. Due to the setting of Dj as described above, channel removed region 106r can be formed without increasing the resistance in JFET region 102j. In this case, removed depth Dj of the surface portion of JFET region 102j is set to satisfy:

$$Dj \leq (Wj - Wr)/2 \times \tan(\theta)$$

$$\leq (Wj - Wr)/2 \times \tan(45°)$$

$$\leq (Wj - Wr)/2$$

According to the above relation, the removed depth of the surface portion of JFET region 102j can be increased, in the case where JFET region 102j is wide or where channel removed region 106r is narrow.

As described above, silicon carbide semiconductor element 200 is configured to satisfy all of Wr≤(Wj−0.25 μm×2), Wj>0.5 μm, and Dj≤((Wj−Wr)/2).

In addition, in the present second exemplary embodiment, channel removed region 106r may be formed along the entire perimeter of unit cell 200u or may be formed only on a portion near the border where at least three or more unit cells 200u are in contact with one another, in a planar view.

It should be noted that, although silicon carbide is 4H-SiC in the above description, any other poly-type (such as 6H SiC, 3C-SiC, or 15R-SiC) may also be adopted. Also, although the principal surface is supposed to have a plane orientation that has been off-cut with respect to a (0001) plane, the principal surface may also be any other plane (such as a (11-20) plane, a (1-100) plane, or a (000-1) plane) or an off-cut plane thereof. Still alternatively, the substrate may be made of Si and the drift layer may be made of silicon carbide (3C-SiC) to form a heterojunction.

The silicon carbide semiconductor element according to the present disclosure is widely applicable to various power control devices and drive devices, such as inverter circuits or chopper circuits.

What is claimed is:

1. A silicon carbide semiconductor element comprising unit cells which are integrated, each of the unit cells comprising:
    a semiconductor substrate of a first conductivity type;
    a first silicon carbide semiconductor layer of the first conductivity type located on a front surface of the semiconductor substrate;
    a drain electrode located on a back surface of the semiconductor substrate;
    a plurality of body regions of a second conductivity type located in the first silicon carbide semiconductor layer so as to be spaced from each other;
    a source region of the first conductivity type located in the body regions;
    a source electrode electrically connected to the source region,
    a junction field effect transistor (JFET) region of the first conductivity type in a region where the body regions are not located on a surface of the first silicon carbide semiconductor layer in a planar view;
    a second silicon carbide semiconductor layer of the first conductivity type located on the surface of the first silicon carbide semiconductor layer;
    a gate insulating film located on a surface of the second silicon carbide semiconductor layer; and
    a gate electrode located on the gate insulating film,
    wherein the second silicon carbide semiconductor layer has, on a side of the gate insulating film, a high-concentration layer including a dopant of the first conductivity type at a higher concentration than at least the JFET region, and
    the second silicon carbide semiconductor layer has a cutout extending from the surface of the second silicon carbide semiconductor layer located on a part of the JFET region to a side closer to the JFET region than to the high-concentration layer, the cutout having a width smaller than a width of the JFET region.

2. The silicon carbide semiconductor element according to claim 1,
    wherein the cutout of the second silicon carbide semiconductor layer is in contact with the JFET region.

3. The silicon carbide semiconductor element according to claim 1,
    wherein a part of the second silicon carbide semiconductor layer is left between the cutout of the second silicon carbide semiconductor layer and the JFET region.

4. The silicon carbide semiconductor element according to claim 2,
    wherein the JFET region has a cutout contiguous to the cutout of the second silicon carbide semiconductor layer.

5. The silicon carbide semiconductor element according to any one of claims 1 to 4,
    wherein the silicon carbide semiconductor element satisfies both of:

$$Wj > 0.5 \, \mu m; \text{ and}$$

$$Wr \leq Wj - 0.25 \, \mu m \times 2$$

where a minimum distance between the body regions spaced from each other is defined as Wj (μm), and a width of the cutout of the second silicon carbide semiconductor layer is defined as Wr (μm).

6. The silicon carbide semiconductor element according to claim 4,
wherein the silicon carbide semiconductor element satisfies all of:

$$Wj>0.5 \text{ μm};\ Wr \leq Wj-0.25\ \text{μm}\times 2;\ \text{and}\ Dj \leq (Wj-Wr)/2$$

where a minimum distance between the body regions spaced from each other is defined as Wj (μm), a width of the cutout of the second silicon carbide semiconductor layer is defined as Wr (μm), and a depth of the cutout of the JFET region is defined as Dj (μm).

7. The silicon carbide semiconductor element according to claim 1,
wherein a thickness of the gate insulating film located in the cutout of the second silicon carbide semiconductor layer is larger than a thickness of the gate insulating film on the second silicon carbide semiconductor layer spaced from the cutout of the second silicon carbide semiconductor layer.

8. The silicon carbide semiconductor element according to claim 1,
wherein the JFET region includes a dopant of the first conductivity type at a higher concentration than the first silicon carbide semiconductor layer.

9. The silicon carbide semiconductor element according to claim 1,
wherein the second silicon carbide semiconductor layer has a cutout on an entire perimeter of each of the unit cells in a planar view.

10. The silicon carbide semiconductor element according to claim 1,
wherein the second silicon carbide semiconductor layer has a cutout formed on a portion near a border where at least three or more of the unit cells are in contact with one another in a planar view.

11. A method for manufacturing a silicon carbide semiconductor element, the method comprising:

a step (a) of forming a first silicon carbide semiconductor layer of a first conductivity type on a front surface of a semiconductor substrate of the first conductivity type;
a step (b) of forming at least two body regions of a second conductivity type in the first silicon carbide semiconductor layer so as to be spaced from each other;
a step (c) of forming a source region of the first conductivity type in the body regions;
a step (d) of forming a second silicon carbide semiconductor layer of the first conductivity type on a surface of the first silicon carbide semiconductor layer;
a step (e) of removing at least a part of the second silicon carbide semiconductor layer overlapping a junction field effect transistor (JFET) region interposed between the body regions, in a planar view, from a surface of the second silicon carbide semiconductor layer;
a step (f) of forming a gate insulating film on a region where at least a part of the second silicon carbide semiconductor layer is removed; and
a step (g) of forming a gate insulating film on a region where the second silicon carbide semiconductor layer is not removed.

12. The method for manufacturing a silicon carbide semiconductor element according to claim 11,
wherein the step (e) includes a step of thermally oxidizing at least a part of the second silicon carbide semiconductor layer.

13. The method for manufacturing a silicon carbide semiconductor element according to claim 11,
wherein the step (e) and the step (f) are simultaneously performed.

14. The method for manufacturing a silicon carbide semiconductor element according to claim 11,
wherein the step (f) and the step (g) are simultaneously performed.

15. The method for manufacturing a silicon carbide semiconductor element according to claim 11,
wherein the step (g) is performed subsequent to the step (f).

* * * * *